US006124211A

United States Patent [19]
Butterbaugh et al.

[11] Patent Number: 6,124,211
[45] Date of Patent: Sep. 26, 2000

[54] CLEANING METHOD

[75] Inventors: Jeffery W. Butterbaugh, Chanhassen, Minn.; David C. Gray, Sunnyvale, Calif.; Robert T. Fayfield, St. Louis Park, Minn.

[73] Assignee: FSI International, Inc., Chaska, Minn.

[21] Appl. No.: 08/541,634

[22] Filed: Oct. 10, 1995

Related U.S. Application Data

[63] Continuation-in-part of application No. 08/259,542, Jun. 14, 1994, abandoned.

[51] Int. Cl.$^7$ ...................................................... H01L 21/00
[52] U.S. Cl. ............................ 438/708; 438/709; 216/59; 216/63; 216/66; 216/79; 134/1
[58] Field of Search ............................... 156/345; 216/63, 216/66, 59, 79; 134/1; 438/708, 709; 252/79.3

[56] References Cited

U.S. PATENT DOCUMENTS

| | | |
|---|---|---|
| 2,841,477 | 7/1958 | Hall . |
| 3,122,463 | 2/1964 | Ligenza et al. . |
| 3,669,774 | 6/1972 | Dismukes . |
| 4,065,369 | 12/1977 | Ogawa et al. . |
| 4,160,690 | 7/1979 | Shibagaki et al. . |
| 4,175,235 | 11/1979 | Niwa et al. . |
| 4,183,306 | 1/1980 | Niwa . |
| 4,183,780 | 1/1980 | McKenna et al. . |
| 4,314,875 | 2/1982 | Flamm . |
| 4,498,953 | 2/1985 | Cook et al. . |
| 4,522,674 | 6/1985 | Ninomiya et al. . |
| 4,540,466 | 9/1985 | Nishizawa . |
| 4,643,799 | 2/1987 | Tsujii et al. . |
| 4,678,536 | 7/1987 | Murayama et al. . |
| 4,687,544 | 8/1987 | Bersin . |
| 4,741,800 | 5/1988 | Yamazaki . |
| 4,749,440 | 6/1988 | Blackwood et al. . |
| 4,857,140 | 8/1989 | Loewenstein . |
| 4,871,416 | 10/1989 | Fukuda . |
| 4,938,815 | 7/1990 | McNeilly . |
| 5,022,961 | 6/1991 | Izumi et al. . |
| 5,028,560 | 7/1991 | Tsukamoto et al. . |
| 5,030,319 | 7/1991 | Nishino et al. . |
| 5,068,040 | 11/1991 | Jackson . |
| 5,157,091 | 10/1992 | Masataka et al. ...................... 526/245 |
| 5,178,682 | 1/1993 | Tsukamoto et al. . |
| 5,178,721 | 1/1993 | Sugino .................................... 156/626 |
| 5,201,994 | 4/1993 | Nonaka et al. . |
| 5,221,423 | 6/1993 | Sugino et al. . |
| 5,228,206 | 7/1993 | Grant et al. . |
| 5,234,540 | 8/1993 | Grant . |
| 5,236,602 | 8/1993 | Jackson . |
| 5,254,176 | 10/1993 | Ibuka et al. . |
| 5,306,671 | 4/1994 | Ogawa et al. .......................... 437/225 |
| 5,350,480 | 9/1994 | Gray ........................................ 156/345 |
| 6,015,759 | 1/2000 | Khan et al. ............................. 438/707 |

FOREIGN PATENT DOCUMENTS

| | | |
|---|---|---|
| 063273 | 10/1982 | European Pat. Off. . |
| 57-200569 | 12/1982 | Japan . |
| 1180187 | 2/1970 | United Kingdom . |

OTHER PUBLICATIONS

Vig, John R., "UV/Ozone Cleaning of Surfaces," *J. Vac. Sci Tehcnol.* A3, May/Jun. (1985) pp. 1027–1034.

Vig, John R., "UV/Ozone Cleaning of Surfaces", *Treatise On Clean Surface Technology*, K.L. MIttal, editor, vol. 1, pp. 1–26, Plenum Press (1987).

T. Aoyama, et al. "Removing native oxide from Si(001) surfaces using photoexcited fluorine gas"; J. Electrochem. Soc., 140, Feb. 1993, pp. 1704–1708.

T. Aoyama et al, "Surface Cleaning for Si Epitaxy Using Photoexcited Gas"; Appl. Phys. Lett., 59, Nov. 1991, pp. 2576–2578.

"Plasmaless dry etching of silicon with fluorine–containing compounds", J. Appl. Phys. 56(10), Nov. 15, 1984, pg. 2939–2942.

"CDE Patent Search—Technical Summary, Chemical Down Stream Etch Tools, Process, and Chemistry", Paul K. Aum, Jan. 7, 1994.

"Mechanisms of the $HF/H_2O$ Vapor Phase Etching of $SiO_2$", C.R.Helms and B.E. Deal, Journal of the IES May/Jun. 1992, pg. 21–26.

"Native oxide removal on Si surface by NF, added hydrogen plasma downstream", Jun Kikuchi, Masao Iga, Shuzo Fujimura and Hiroshi Yano, SPIE vol. 2091, pg. 154–159.

"Silicon Surface Cleaning Using Photoexcited Flouirne Gas Diluted with Hydrogen", Takayuki Aoyama, Tatsuya Yamazaki, and Tokashi Ito, J. Electrochem. Soc., vol. 140. No. 6, Jun. 1993, pg. 1704–1708.

"A Dry Etching Technology Using Long–Lived Active Species Excited by Microwave", Y. Heriike and M. Shibagaki, Toshiba Research and Development Center, Tokoyo Shibata Electric Co Ltd. Kawasaki, Japan.

"Highly Selective Etching of $Si_2N_4$ to $S_1O_2$ Employing Fluorine and Chlorine Atoms Generated by Microwave Discharge", S. Sutoj N. Hayasaka, H. Okano, and Y. Henike. J. Electrochem. Soc. vol. 136, No. 7, Jul. 1989, pg. 2032–2034.

"Directonal Dry Etching of Silicon by a Reactive Nomle–Jet", Hideo Akiya, Prec. of DPS. pg. 119–126, Oct. 1981, Tokyo, Japan.

(List continued on next page.)

*Primary Examiner*—Thorl Chea
*Attorney, Agent, or Firm*—Vidas, Arrett & Steinkraus, P.A.

[57] ABSTRACT

A method for removing native oxides and other contaminants from a wafer surface while minimizing the loss of a desired film on the wafer surface. The method is carried out in a hermetically sealed reactor. A fluorine-containing gas or gas mixture is passed over the wafer during simultaneous exposure to ultraviolet radiation in the absence of added water, hydrogen, hydrogen fluoride or hydrogen containing organics, thereby avoiding the production of water as a reaction product. The addition of ultraviolet radiation and the elimination of water, hydrogen, hydrogen fluoride and hydrogen containing organics provides for the nearly equivalent (non-selective) removal of various forms of oxide and also provides for improved process control.

21 Claims, 7 Drawing Sheets

OTHER PUBLICATIONS

"Pad Oxide Roughing in a Remote Plasma High Process for Silicon Nitride Using an In Sita Spectral Ellipsometer", Lee M. Lowenstein, Red K. Pehlmeier, Stephen A. Henck and Walter M. Duncan, PRCC. of ECS, vol. 93(21), pg. 373, 1993.

"Selective Etching of silicon nitride using plasmas of $CF_4$ and $SF_4$", Lee M. Loewenstein, J. Vac. S.I. Technol. A. vol. 17, No. 3 May/Jun. 1989, pg. 636–1394.

Selective Isotropic Dry Etching of $Si_2N_4$ of S.O: F.H.M. Sundras, J. Dieleman, B.J.B. Peters, and J. A.M. Sanders, J. Electrochemical Soc. vol. 129, No. 11. pg. 2559–2600.

"Highly Selective Etching off $Si_2N_4$ Over $S.O_2$ Employing a Downstream Type Reactor", N. Hayasaka, H. Chamo, Y. Henile, Solid State Technology, Apr. 1988, pg. 127–139.

"Highly Selective Etching of $Si_2N_4$ Over $SO_2$ Employing a Downstream Type Reactor", N. Hayasaka, H. Chano, Y. Henike, Solid State Technology, Apr. 1988, pg. 127–130.

Initiation Phenomina in Pulled Chemical . . . P. Menan, R. Bruce Doak, Prepared for Naval Research Laboratory, Oct. 1978.

"Photochemistry of Interhalegon Composites of Interluekens Rocket Propellants", Arthur E. Anworthy, R. D. Wilren, K. H. Mueller, prepared for Air Office of Scientific Research, Sep. 1973.

"Plasmaless Dry Etching of Silicon Nitride Films with Chlorine Trilucride Gas", Yoji Saito, Masahiro Hirabara, Akira Yoshida, IEICE Trans. Electron, vol. E75 C, No. 7, Jul. 1992, pg. 834–838.

"Reaction Mechanisms For the Photon–Enhanced Etching of Semiconductors: An Investigation of the UV–Stimulated Interaction of Chlorine With Si(100)", by R. B. Jackman et al, *Surface Science* 176 (1986) 183–92.

"Wafer Cleaning With Photo–Excited Halogen Radical", Takashi Ito, Fujitsu Laboratories Ltd., 1991, Proceedings—Institute of Enviromental Sciences.

"Plasmaless Cleaning Process of Silicon Surface Using Chlorine Trifluoride" by Yoji Saito, Osamu Yamoka et al, *Appl. Phys. Lett.* 56(12) Mar. 19, 1990, pp. 1119–1121.

"Selective Etching of Native Oxide by Dry Processing Using Ultra Clean Anhydrous Hydrogen Fluoride" by N. Miki et al, 730 IEDM 88.

"Selective Interhalogen Etching of Tantalum Compounds and Other Semiconductor Materials" by D. E. Ibbotson et al. *Appl. Phys. Lett.* 46(8), Apr. 15, 1985. pp. 794–796.

"Characterization of Wafer Cleaning and Oxide Etching Using Vapor–Phase Hydrogen Fluoride" by M. Wong et al. *I. Electrochem. Soc.*, vol. 138, No. 6, Jun. 1991, pp. 1779–1802.

"Wafer Temperature Dependence of the Vapor–Phase HF Oxide Etch" by Man Wong et al, *J. Electrochem. Soc.*, vol. 140, No. 1 pp. 205–208.

"Vapor Phase Cleaning of Submicron Inter–Metal Vias" by Daniel P. Gay et al, *FSI Technical Report*, TR397, Nov. 5, 1993.

"A New Cleaning method by Using Anhydrous $HF/CH_3OH$ Vapor System" by A. Izumi et al, EOS Proceedings, vol. 92–12 (1992), pp. 260–267.

"Etching of Thermal Oxides in Low Pressure Anhydrous HF/CH3 OH Gas Mixture at Elevated Temperature", by J. Ruzyllo et al. *J. Electrochem. Soc.*, vol. 140, No. 4, Apr. 1993, pp. L64–L66.

Abstract: Pat. No. 3,511,727 to Hays, issued May 7, 1912.

Abstract: Pat. No. 5,240,554 to Hayaski Hisataka, issued Aug. 31, 1993.

Abstract: Pat. No. 5,122,225 to Monte issued Jun. 16, 1992.

Abstract: Pat. No. 5,094,978 to Miyagaki Shinji et al issued Mar. 10, 1992.

Abstract: Pat. No. 4,717,447 to Dieleman issued Jan. 5, 1988.

Abstract: Pat. No. 4,574,177 to Wang issued Mar. 4, 1986.

Abstract: Pat No. 4,125,672 to Kakushi et al issued Jan. 14, 1978.

Abstract: Pat. No. 4,440,883 to Pammer Erich issued Apr. 3, 1984.

Abstract: Pat. No. 4,310,380 to Flamm issued Jan. 12, 1982.

Abstract: Pat. No. 5,069,724 to Fujii et al issued Dec. 3, 1991.

Abstract: Pat, No. 4,799,991 to Dockrey issued Jan. 24, 1989.

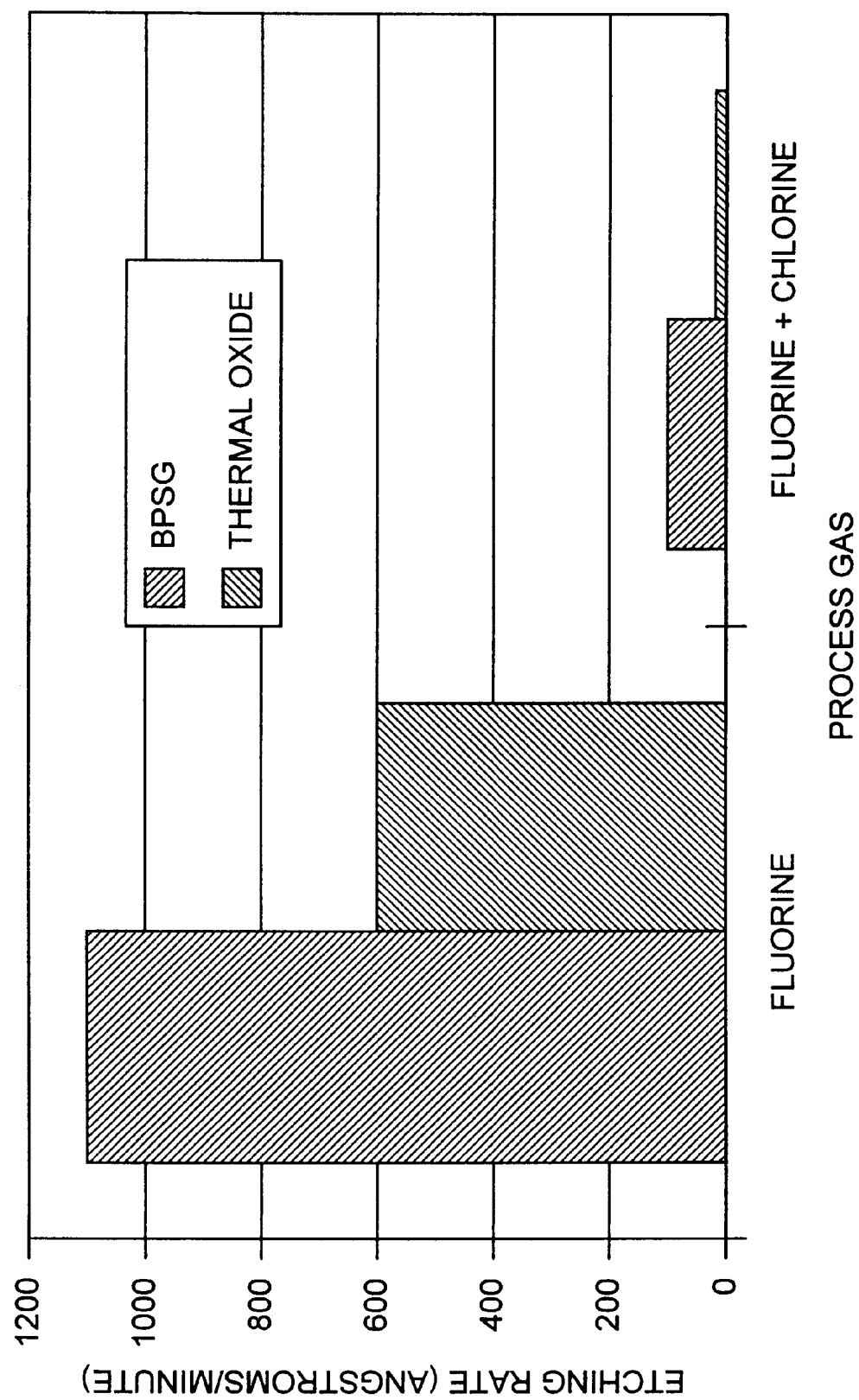

CLEANING METHOD

CROSS REFERENCE TO RELATED APPLICATION

This application is a continuation-in-part of application Ser. No. 08/259,542, now abandoned, filed Jun. 14, 1994.

BACKGROUND OF THE INVENTION

The present invention relates to the removal of an undesired material from the surface of a substrate with a desired material in place on the substrate while minimizing the loss of the desired material. It finds particular application in the etching, cleaning, or removal of silicon oxide and contaminant films from semiconductor surfaces or in topographic features of a semiconductor wafer. In particular, it relates to the removal of silicon oxides and other contaminants in a dry, gas-phase environment where ultraviolet (UV) light stimulation and a fluorine-containing molecular gas such as chlorine triflouride are used to etch different forms of silicon dioxide at similar rates without the significant generation of water as a reaction by-product.

In semiconductor device processing, oxides of silicon are used in many different forms for many applications. Dense, thermally grown oxides of silicon are typically used as the primary gate dielectric film in MOS (metal oxide-silicon) transistors. Steam grown thermal oxides are commonly used as a field oxidation dielectric layer. Doped oxides such as phosphosilicate glass (PSG) and borophosphosilicate glass (BPSG) are commonly used as inter-metal layer dielectrics because they can be easily planarized with an elevated temperature reflow process. Spin-on-glass (SOG) is also used in dielectric applications where planarization is critical. An SOG is a siloxane-type polymer in an organic solvent which is deposited in liquid form and then cured at elevated temperature to form a solid silicon oxide film.

During the processing of silicon based semiconductor devices, other types of oxide films may be formed as the result of exposure of silicon surfaces to chemical processing steps, or to the ambient environment. For instance, the well known RCA wet cleaning sequence is known to leave a 10–20 Å "chemical" oxide on the surface. Exposure of a clean silicon surface to ambient atmosphere results in the growth of a 5–10 Å "native" oxide. In many cases, these residual oxides are considered surface contaminants since they must be removed to reveal a pristine silicon surface to allow the formation of a high quality electrical interface. Interlayer metal contacts made through vias or "contact holes" in a dielectric layer such as BPSG are of high quality only when oxides and contaminants on the lower metal or polysilicon level are removed. Often the contamination in contact holes or on feature sidewalls which is the result of plasma or reactive ion etching processes may be comprised of a mixture of silicon oxides, silicides or oxides of metals, and organic contaminants.

Very often, it is necessary to remove a chemical or native oxide, or post-etch residue contamination from a pattern feature bottom or from an exposed wafer surface in the presence of one or more of the many other types of silicon oxides mentioned above. It has long been known that vapors of HF/water mixtures will etch various silicon oxide films. This technology has been studied and commercialized (U.S. Pat. Nos. 4,749,440 and 4,938,815). However, several limitations are sometimes encountered in the use of HF vapor phase etching of oxide films. These limitations can include the formation of non-volatile residues which must be rinsed away, and low etching rates for native and chemical silicon oxide films relative to doped silicon oxide films. In addition, water is generated as a reaction by-product, which can make the anhydrous HF processes difficult to perform controllably and repeatably. Water is in general among the most undesirable of chemical species to have present in a vacuum environment.

The relative rate of etching (selectivity) of the HF vapor etching processes to many different types of oxide films has also been studied. The results show that native, chemical, and thermal oxides are typically removed at rates 10 times slower than the removal rates of PSG and BPSG doped silicon oxides. This is problematic in several common processing circumstances. First of all, it is commonly necessary to clean native oxide and other contaminants from the bottom of contact holes formed in films of BPSG. Using the current vapor phase processes, several hundred angstroms of the BPSG are removed before the silicon oxides and contaminants in the bottom of the contact hole are removed. Etching a large quantity of BPSG is unfavorable and may leave undesirable residues. Second, it is common to use composite structures of different types of silicon oxide films. For instance, a BPSG layer sandwiched between two undoped silicon oxide layers is sometimes used as a dielectric film between metal layers. Cleaning of contact or other topographic features through this type of composite film with the current HF vapor technology causes enhanced lateral etching of the BPSG layer relative to the undoped silicon oxide layers. This results in an undercut profile which is difficult to fill with subsequent films without forming voids. For this case, a non-selective oxide removal process is most desirable, i.e., a process that etches native, chemical, and thermal oxides at nearly the same rate as doped oxides. Third, it is sometimes desirable to remove a thermal oxide film over a doped oxide without over-etching the doped oxide extensively.

Attempts have been made to address the limitations of the aqueous HF vapor technology described above by substituting alcohol vapor in place of water vapor in combination with the HF gaseous reactant. However, water is generated as a by-product of the process, leading to many of the same limitations as the aqueous HF vapor technologies. Furthermore, the use of HF with alcohol vapor gives very high removal rates of BPSG relative to native oxide contamination. Also, the use of HF with alcohol vapor in the presence of BPSG can still result in problematic residue formation.

Other attempts to remove silicon oxide films in a dry, gas-phase reaction environment have been made which do not utilize HF. The effluent from a plasma of nitrogen trifluoride ($NF_3$) and hydrogen ($H_2$) has been used to remove oxide films. Also, fluorine ($F_2$) and hydrogen mixtures with UV illumination have been used to remove oxide films. The presence of hydrogen in the reaction chemistry still leads to the formation of water as a reaction by-product.

Previous work with $ClF_3$ (U.S. Pat. No. 4,498,953) indicated that thermal oxide removal rates with $ClF_3$ exposure were not measurable. It was, in fact, reported that silicon oxide was successfully used as mask material in the etching of silicon by $ClF_3$. This work did not utilize UV illumination.

SUMMARY OF THE INVENTION

The purpose of this invention is to overcome the limitations of current silicon oxide removal technologies which utilize hydrogen-containing gas mixtures such as $HF/H_2O$ and $ClF_3$/alcohol which allow HF formation in situ to etch silicon oxides with and without UV irradiation. These limitations include the generation of substantial water as a reaction by-product, and the unfavorable removal of doped silicon oxides at rates which are very large compared to the removal rates of native or chemical oxides. In addition, these processes frequently lead to the production of colloidal residues of silicon oxide, metasilicic acid, and fluosilicic acid which must often be removed by wet rinsing before subsequent device processing.

The invention in one aspect comprises a method of removing an undesired material from a substrate. Typically the undesired material comprises an unwanted silicon oxide, with which may be associated other metallic, organic and inorganic contaminants. These contaminants may be incorporated into the silicon oxide, at the $Si/SiO_2$ interface, or on the $SiO_2$, as a result of previous processing steps or incidental ambient exposure. The method comprises placing the substrate in a gaseous environment comprising at least one fluorine-containing gas selected from the group consisting of fluorine and fluorine containing gases, other than $F_2O$, which are free of hydrogen and which can be photodissociated, the gaseous environment being substantially free of water, hydrogen, hydrogen fluoride and hydrogen containing organic compounds, and exposing the substrate to UV irradiation in the presence of the gaseous environment until the undesired material has been removed.

A further aspect of the invention is a method for cleaning or removing undesired silicon oxide material formed as a result of ambient exposure of the wafer surfaces or formed as an incidental result of wet or gaseous chemical processing steps, from the surfaces of a silicon wafer substrate with a desired doped silicon oxide material in place on the substrate while minimizing the loss of the desired material, comprising the steps of:

(a) evacuating a hermetically-sealed processing chamber to a low base pressure, (b) introducing a silicon wafer substrate into the processing chamber, (c) introducing into said chamber and exposing the silicon wafer in said chamber to a gaseous environment comprising at least one fluorine-containing gas selected from the group consisting of fluorine and fluorine containing gases, other than $F_2O$, which are free of hydrogen and which can be photodissociated, the gaseous environment being substantially free of plasma products, water, hydrogen, hydrogen fluoride and hydrogen containing organic compounds, (d) exposing the gaseous environment and substrate in said chamber to ultraviolet light, (e) evacuating the processing chamber, and (f) removing the substrate from the processing chamber.

A still further aspect of the invention is a method of removing an undesired material from a silicon, silicon oxide or gallium arsenide substrate, the substrate comprising on at least a portion of the surface thereof a silicon oxide material which is desired to be retained on the substrate, the desired silicon oxide material being selected from the group consisting of doped silicon oxide, deposited silicon oxide, and thermally grown silicon oxide, and the undesired material includes one or more members selected from the group consisting of silicon oxides formed as a result of ambient exposure of the substrate surfaces, silicon oxides formed as an incidental result of wet or gaseous chemical processing steps, and other trace silicon oxides, the method comprising placing the substrate in a gaseous environment comprising at least one fluorine-containing gas which is free of hydrogen and which can be photodissociated, the gaseous environment being substantially free of plasma products, water, hydrogen, hydrogen fluoride and hydrogen containing organic compounds, and exposing the substrate to UV irradiation in the presence of the gaseous environment until the undesired material has been removed.

The invention is particularly applicable to the cleaning of silicon oxide and other types of contaminants in metal contact vias through BPSG or BPSG and thermal oxide sandwich structures since the BPSG film is not rapidly etched relative to the other silicon oxides during the contact hole cleaning process. The present invention addresses several of the limitations noted above for the etching or cleaning of oxide films in the dry, gas phase, and the removal of native oxides or other contaminants without the concurrent rapid removal of doped oxide films.

BRIEF DESCRIPTION OF THE DRAWINGS

FIG. 9 is a graph showing the relative etching rates of boron phosphorous doped silicate glass (BPSG) and undoped (thermally grown) oxide using UV-activated $F_2$ and $F_2+Cl_2$ processes according to alternate embodiments of the present invention.

DETAILED DESCRIPTION OF THE PREFERRED EMBODIMENTS

Figure 1:
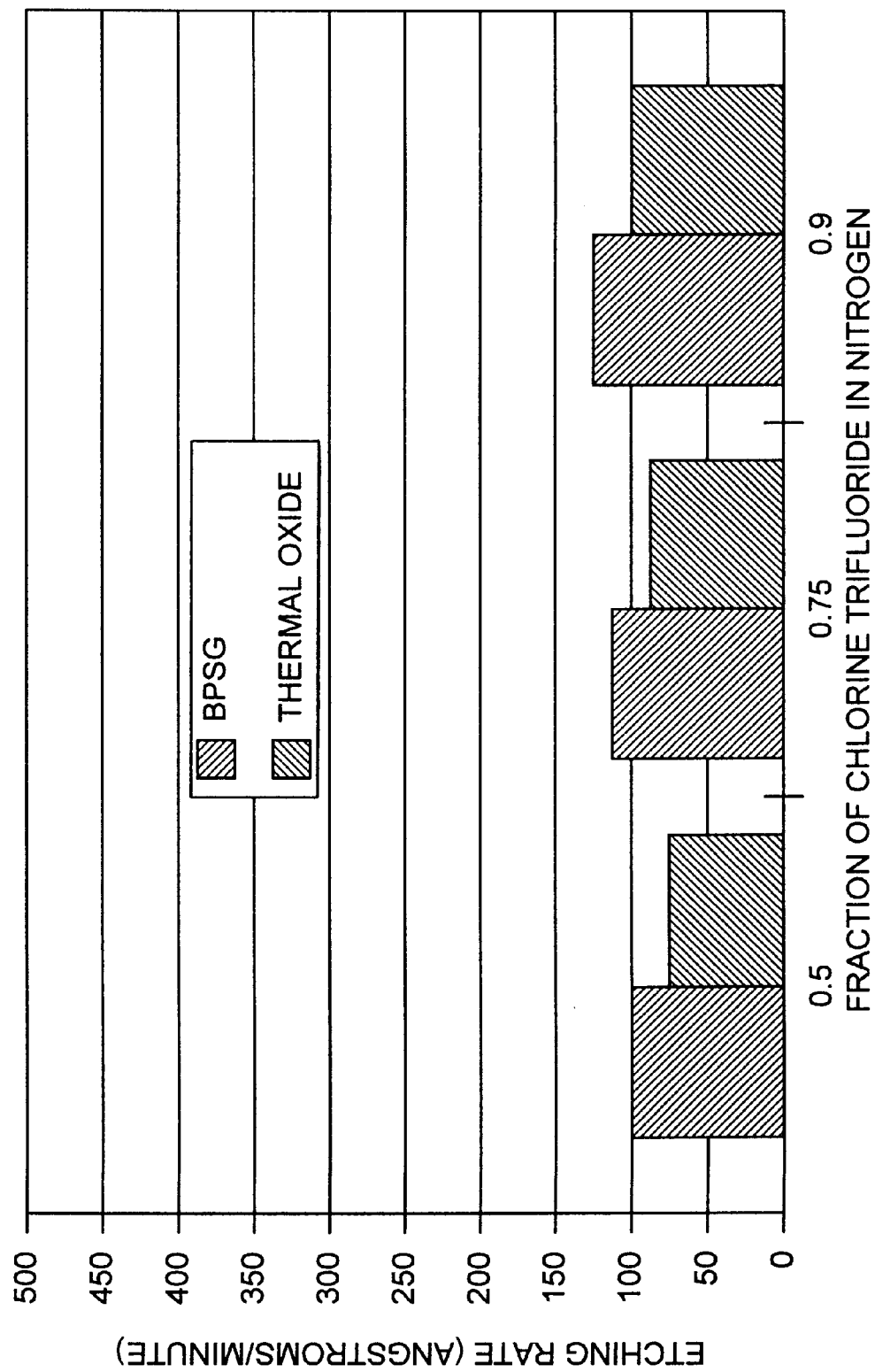
FIG. 1 is a graph which shows the relative etching rates of boron-phosphorous doped silicate glass (BPSG) and undoped (thermally grown) oxide using a UV-activated $ClF_3$ process according to a preferred embodiment of the present invention.

In its various embodiments one or more of the following objects may be obtained.

One object and advantage of the present invention is to allow removal of either trace oxide films of under 30 Å thickness or bulk oxide films of greater than 30 Å thickness without the significant generation of water as a by-product of the reaction process. Trace oxide films may include native oxides grown in ambient, chemical oxide layers grown in oxidizing atmosphere (for instance an oxidizing plasma) or in liquid solution, or thin oxide layers grown by other means. Bulk oxide films include thermally grown oxides, steam grown thermal oxides, CVD oxides, plasma grown oxides, doped oxides, spin-on-glass and other thick silicon oxide containing films used in the fabrication of semiconductor devices. As a consequence of the substantially anhydrous and hydrogen free environment, HF is not expected to be formed in situ in the reaction process chamber to any substantial degree, and water is not formed as a significant by-product of the primary silicon oxide removal reaction pathway.

A second object and advantage of the present invention is to allow the removal of native, chemical, and thermal oxide films at rates comparable to the removal rates of doped oxide films such as BPSG or PSG. The present invention does not use HF oxide removal chemistry which is sensitive to the level of water or water forming hydrides in the various oxide films, which causes them to etch at different rates.

A third object and advantage of the present invention is to improve the endpoint control in the etching of silicon oxide films in a dry environment through the use of a modulated or shuttered UV lamp or UV laser of the appropriate power and wavelength. The etching rate of the various oxide films mentioned above can be controlled by adjusting the power of the impinging UV light.

Another object and advantage of the present invention is to allow the cleaning of trace oxides and other contaminants from metal contact vias and from other topographic features formed in thick oxide films or in thick composites containing various oxide films. The nearly equal removal rates of different oxide films allows cleaning of the feature bottoms without significant under cut of the thick oxide film, or lateral under-cut of thick composite oxide layers. There is further no need for the adsorption of water or alcohol film in the via bottoms which is difficult to subsequently desorb from very small topographic features due to capillary forces.

Another object and advantage of the present invention is to allow the cleaning of plasma etch residues which remain on the wafer after the etching of metal patterns. Current methods for removing these residues include the HF-water vapor process which has poor selectivity to underlying doped oxide films, or solvent based rinsing processes with problems of waste disposal. These residues are typically a mixture of different silicates and may be removed with the current invention with good selectivity to the underlying doped oxide layer due to the nearly equal removal rates of various oxides.

The substrate materials which can be treated by the present process can generally be any type of substrate material, but commonly will constitute Si, $SiO_2$ (including quartz) or gallium arsenide wafer substrates.

Suitable fluorine containing gases usable in the invention include, in addition to fluorine, fluorine interhalogens, fluorides of sulfur and xenon difluoride. In alternate embodiments the present invention utilizes $F_2$, $ClF_3$, $BrF_3$, $SF_6$ or mixtures of fluorine containing gases with chlorine, for instance $F_2/Cl_2$, $ClF_3/Cl_2$ or $BrF_3/Cl_2$ mixtures, together with UV irradiation in the wavelength range of 180 to 600 nm, to remove various silicon oxides at nearly equal rates and without the generation of substantial water. The etching of doped silicon oxides (BPSG, PSG, BSG) occurs at rates similar to that of thermal, chemical, or native silicon oxides over a large, useful range of process parameters. Solid residues characteristic of HF gas or vapor phase etching processes are not observed to form.

The gaseous environment substantially free of water, hydrogen, hydrogen fluoride and hydrogen containing organic compounds. Desirably water is present at less than 0.1% and other hydrogen containing gases at less than 1%. Technical grade anhydrous fluorine containing gases, for instance technical grade $ClF_3$, will generally suffice. Preferably the purity of all of the gases employed in the gaseous environment, as certified by the vendors, will be greater than 99% purity, more preferably 99.9% certified purity.

In practice of the inventive method, a source of the fluorine-containing gas is connected to a processing chamber containing the substrate material to be etched or cleaned. The processing chamber suitably comprises a vacuum vessel constructed of chemically inert material, which is hermetically sealed from the ambient atmosphere and can be evacuated to better than 20 millitorr base pressure by means of suitable vacuum apparatus. The processing chamber is evacuated to a low base pressure, for example 20 millitorr. The substrate is desirably introduced into the processing chamber through an isolated load-lock chamber which can be pumped down to a similar base pressure. Introduction or removal of the substrate from the process chamber occurs through the load-lock chamber to prevent the introduction of atmospheric contaminants, particularly water vapor, into the process chamber. Alternatively, the substrate may be introduced into the chamber before evacuation.

The process specifically occurs in the substantial absence of a plasma or plasma products, such as a downstream plasma effluent.

The process chamber may also share a transfer interface with a vacuum cluster robotic transfer unit which allows sequential transfer of substrate materials to or from other process modules without exposure to ambient atmosphere.

A fluorine-containing gas such as $ClF_3$ is introduced into the process chamber to produce a gaseous environment in which the fluorine containing gas forms a substantial partial pressure over the substrate, suitably in the range of 0.001–760 torr. However, the fluorine containing gas will generally be introduced in mixture with one or more inert or facilitating gases. The inert gas may be any gas which is inert to the materials to be treated and which will remain in the gaseous phase under the processing conditions present. Suitable gases include nitrogen, argon, and helium. The facilitating gas is a gas which assists in the cleaning process, for instance helping to increase selectivity for particular contaminants or removal of specific materials or in providing an improved surface morphology. The facilitating gas may be, for instance, chlorine ($Cl_2$), bromine ($Br_2$), oxygen ($O_2$) and mixtures of two or more of these gases. Other non-hydrogen containing gases which provide a source of atomic chlorine, bromine or oxygen by photodissociation may also be used, for instance $CCl_4$, H-free chlorofluorocarbons such as $CF_3Cl$ and H-free bromofluorocarbons such as $CF_3Br$.

The gas mixture may be introduced into the processing chamber in a manner which creates a uniform radial laminar flow pattern over the substrate, for instance through a gas distribution showerhead. In this manner removal of etching products and contaminants is facilitated through entrainment in the laminar flow stream. However, the present invention may be accomplished using other reactive gas flow patterns or in an approximately stagnant gaseous environment.

Both the fluorine-containing gas phase above the substrate and the substrate surface to be processed are illuminated with UV light, suitably through a UV transparent window in the processing chamber. Broad-band UV radiation in the wavelength range of 180–600 nm may be used, as may narrower band sources providing substantial output in the 180–420 nm range. Suitable sources are medium pressure Hg lamps and Xenon lamps. The UV radiation may be pulsed or continuous. A laser and suitable optics may also be used to generate the required UV photon flux. Substrate film and contaminant removal rates may be controlled to a large degree by the intensity of the UV radiation, the UV photon energy, the UV exposure time and/or the UV lamp or laser pulsing rate.

Following treatment, the processing chamber is evacuated and the substrate is removed.

Figure 3:
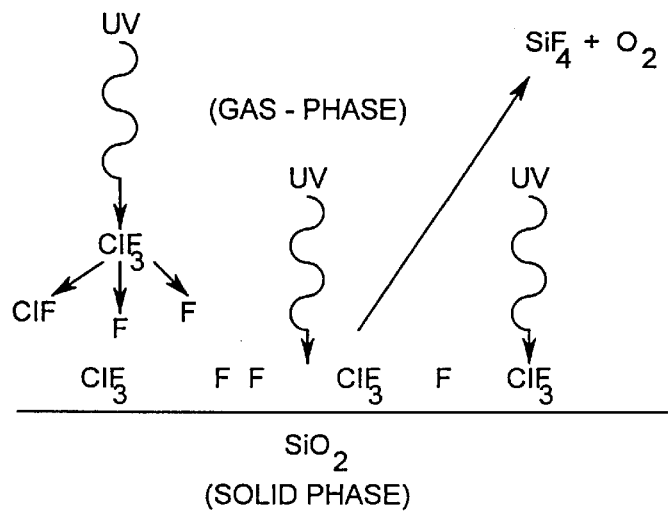
FIG. 3 is a schematic diagram illustrating important chemical mechanisms involved in UV-enhanced silicon oxide film etching according to a preferred embodiment of the present invention.

FIG. 3 illustrates the chemical processes which facilitate silicon oxide etching and contamination removal in one preferred embodiment. Broadband UV illumination in the 180–400 nm wavelength region is known to efficiently photodissociate $ClF_3$ resulting in the production of gas phase atomic fluorine (F). F is fairly long-lived in the gas phase and is convectively and or/diffusively transported to the various substrate surfaces. F is known to etch silicon oxides at a very slow, but finite rate at temperatures below 300° C. However, the direct, simultaneous UV irradiation of the surface allows enhancements in the fluorine etching rate of various oxides by over an order of magnitude. Mechanisms which are important in this UV surface rate enhancement effect may include breaking of surface bonds by UV photons over 2 eV in energy, and the formation of electron-hole pairs at the substrate surface. In the present invention, UV light stimulation has been recognized to be the dominant factor in determining the overall oxide film etching rate according to the global reaction:

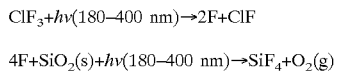

$$4F+SiO_2(s)+h\nu(180–400 \text{ nm}) \rightarrow SiF_4+O_2(g)$$

Figure 2:
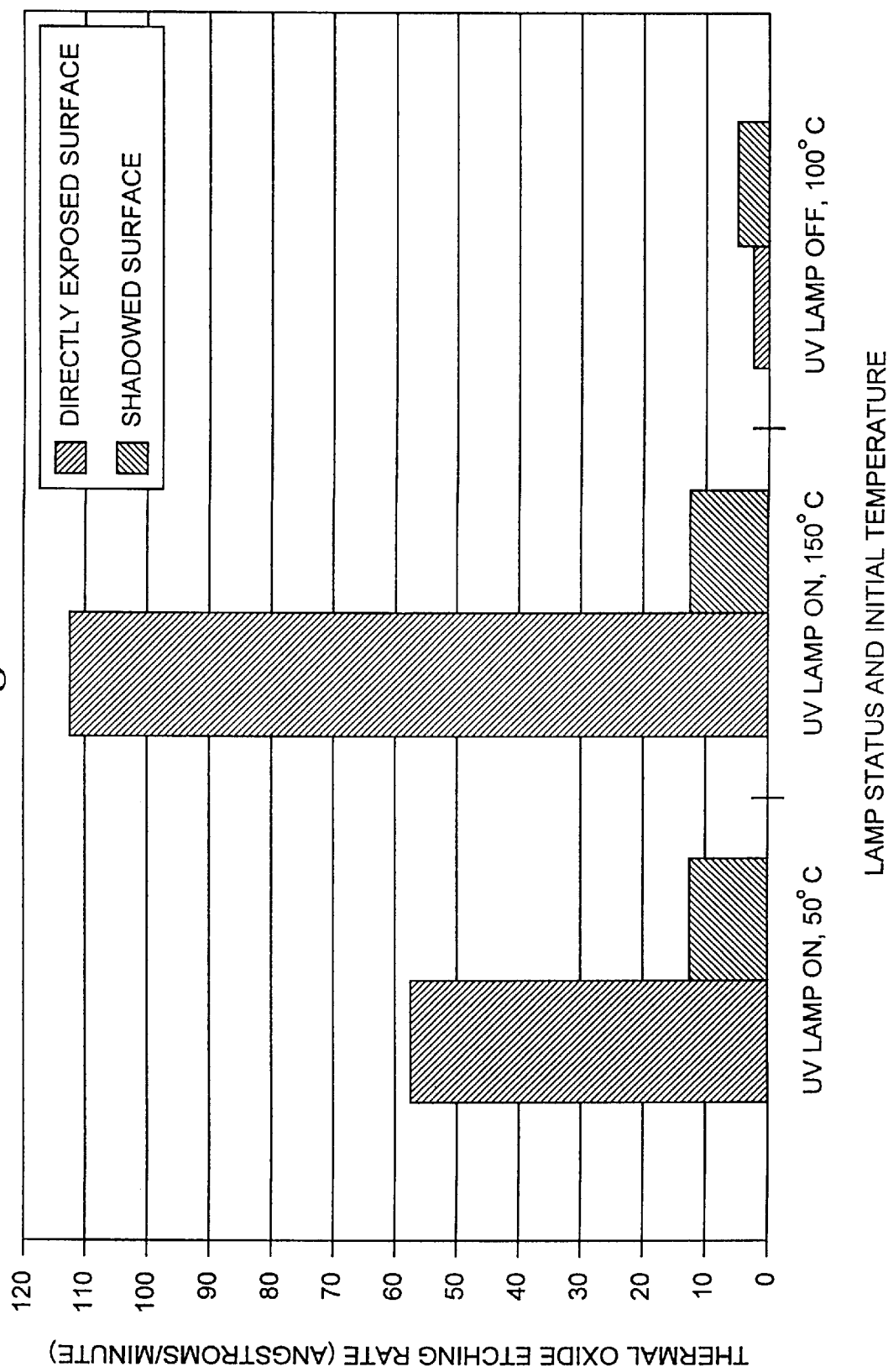
FIG. 2 is a graph showing the enhancement in the rate of etching of thermally grown oxide films by exposure to a UV illuminated gas mixture of $ClF_3$ and $N_2$, both with direct and without direct (i.e. "shadowed") UV exposure of the oxide surface.

Water is not generated as a substantial reaction by product since hydrogen containing gases are not used, and residual chamber water levels are typically in the ppm range. Unlike HF chemistry which etches various silicon oxides at rates which are affected by the degree of hydrogen incorporation in the oxide film (doped oxide films have a higher degree of hydrogen incorporation), the etching of doped versus undoped silicon oxides using the above described UV/$ClF_3$ process occurs at substantially similar rates (FIG. 2).

By similar mechanisms F species are effective in removing carbonaceous and other trace contaminants by selective etching reactions or through entrainment mechanisms. Surface carbon residues may be removed according to the reaction:

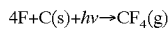

Thus, the present invention will remove carbon residues (undesired material) from the surface of a substrate.

Undissociated $ClF_3$ also reacts spontaneously with most organic residues. The present process will therefore remove most organic residues (undesired material) from the surface of a substrate.

Both photolytically produced F species and $ClF_3$ gas are effective in removing certain trace metals such as titanium, tantalum, tungsten, and molybdenum as well as their silicides and nitrides. Other trace metal contaminants such as iron, copper, and aluminum may be removed by adding a chlorine gas component into the above described mixture. Chlorine is effectively photodissociated into chlorine atoms by UV irradiation in the 200–600 nm range. Chlorine atoms react spontaneously with some trace metal contaminants to form volatile metal chlorides. Removal of some types of involatile metals which are incorporated into contaminant films may be accomplished through entrainment in the product stream as the primary bulk of the film is etched and the metal particles are undercut. Therefore the present invention will remove such trace metals (undesired material) from the surface of a substrate.

Figure 5:
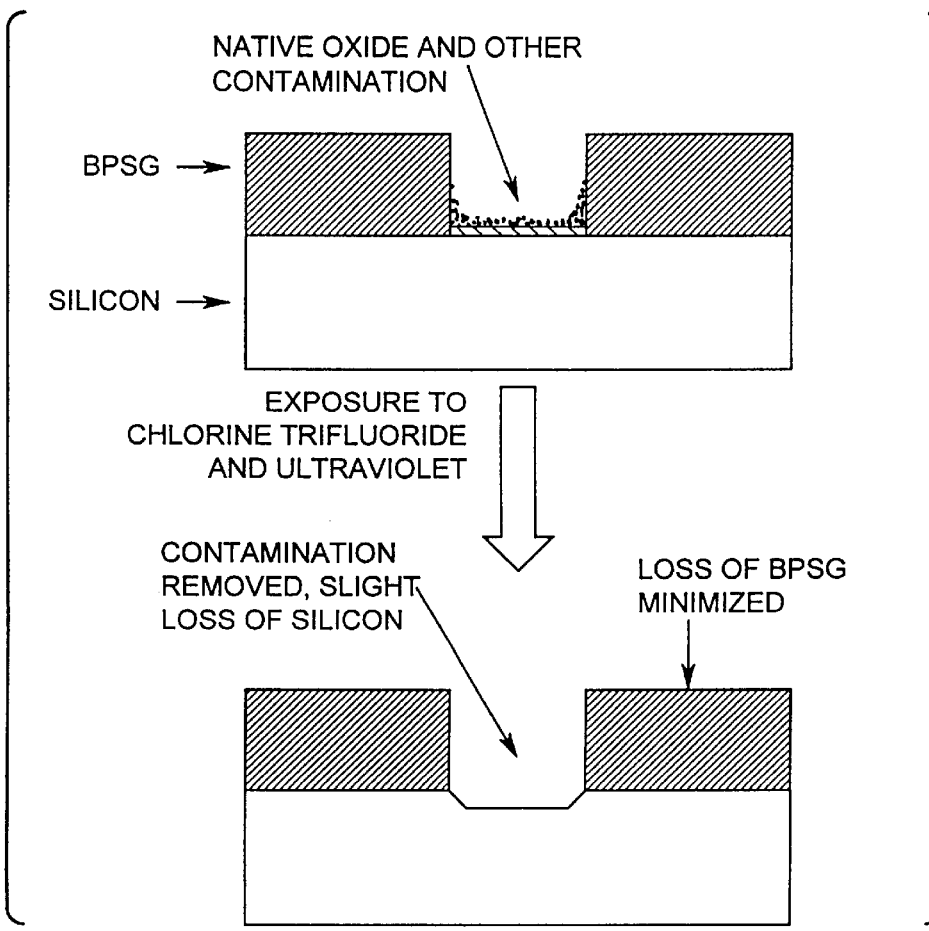
FIG. 5 is a schematic showing the removal of native oxide and other contaminants from the bottom of a contact window which has been etched into a doped oxide (BPSG) film.

A particular feature of the inventive method is the facilitation of the removal of contaminants from high aspect ratio features while minimizing the loss of BPSG and avoiding the production of water and other residues as by-products. One application of this feature is the cleaning of trace silicon oxide and other contaminants from the surface of a silicon wafer at the bottom of a contact hole formed in a BPSG film. Post reactive-ion-etching (RIE) contaminants (undesired material) may also exist on the feature sidewalls. This feature is illustrated in FIG. 5 which shows that contaminants would be removed from the silicon wafer surfaces with minimal removal of the desired BPSG film.

Figure 8:
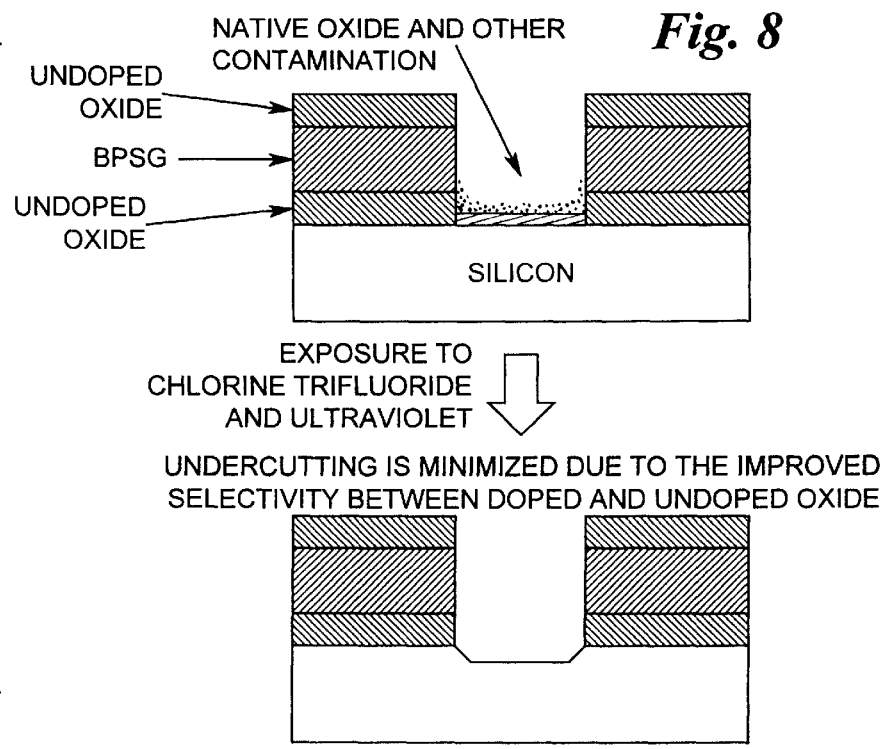
FIG. 8 is a schematic showing the removal of native oxide and other contaminants from a feature bottom which is etched into a composite dielectric film comprising alternating layers of doped and undoped oxide.

Another application of the invention is the cleaning of trace silicon oxide and other contaminants from the surface of a silicon wafer at the bottom of a contact hole formed in a composite dielectric film formed from alternating layers of doped and undoped silicon oxide. This application is illustrated in FIG. 8 which shows that lateral under-cut of the doped oxide (BPSG) layer sandwiched in between undoped (thermal) oxide layers is avoided by the present invention while the contaminants are removed.

The following non-limiting examples further illustrate the present invention.

EXAMPLE 1

Blanket films of thermally grown silicon oxide and of deposited BPSG were removed from a silicon wafer. The silicon oxide film was thermally grown to a thickness of 4000 angstroms on the surface of a silicon wafer by heating the wafer to 1000 degrees centigrade in the presence of hydrogen and oxygen. BPSG consisting of approximately 5% boron and 5% phosphorous was deposited to a thickness of 5000 angstroms onto the surface of a silicon wafer by a chemical vapor deposition (CVD) process. The BPSG films were subsequently annealed in oxygen at 1000 degrees centigrade for 30 minutes. The silicon wafers were introduced into a vacuum process chamber through a load-lock at a base pressure of 20 mtorr. $ClF_3$ gas was introduced with a nitrogen carrier in a radial laminar flow over substrate wafers at 1000 sccm. The equivalent $ClF_3$ partial pressure above the substrate was varied from 50 torr to 90 torr. The total process pressure of the $ClF_3$/nitrogen gas mixture was held at 100 torr. The initial wafer temperature preceding UV lamp exposure was 150° C. The $ClF_3$ gas phase and the substrate were simultaneously exposed to direct UV illumination from a medium pressure mercury arc lamp for 1 minute. The process chamber was then evacuated to its base pressure and the wafer was removed through the load-lock. The thickness of the remaining BPSG film was measured by spectroscopic reflectometry and compared with measurements made before processing to determine the amount of film removed during the simultaneous exposure of the wafer to $ClF_3$ and UV illumination.

FIG. 1 is a graph of the results of the process runs described in the preceding paragraph. Film removal over a one minute exposure of the films is plotted as a function of chlorine trifluoride fraction in nitrogen. Without chlorine trifluoride added to the nitrogen no film removal is detected. The removal of the BPSG film is equivalent within 20% to that of the thermal oxide film. Without UV illumination of either the gas-phase or the substrate, the removal of both thermal oxide and BPSG are below the detection limit.

EXAMPLE 2

Silicon wafers were processed as described in Example 1, except that small areas of the wafer surface were "shadowed" from UV illumination. The masking was with small pieces of anodized aluminum, approximately 0.5 inch square by 0.05 inch thick, which were placed over the wafer surface. Small alumina beads were used to maintain a spacing between the wafer surface and the masking piece such that the wafer surface under the mask was exposed to the gas and any gas-phase products of UV illumination without receiving direct UV illumination. For thermal oxide prepared as described in Example 1, and under process conditions of 250 sccm $ClF_3$ flow, 750 sccm nitrogen flow and 100 torr total pressure, film removal rates in the shadowed and unshadowed regions were typically 10–20% of the removal rate with direct UV illumination of the substrate as shown in FIG. 2. Also shown are results for etching of the shadowed and unshadowed regions under conditions of no UV illumination, where no significant oxide etching is detected. This example illustrates the overwhelming mechanistic importance of direct UV exposure of the substrate surface for rapid etching of oxides by photodissociated F atoms as illustrated in FIG. 3.

EXAMPLE 3

Figure 4:
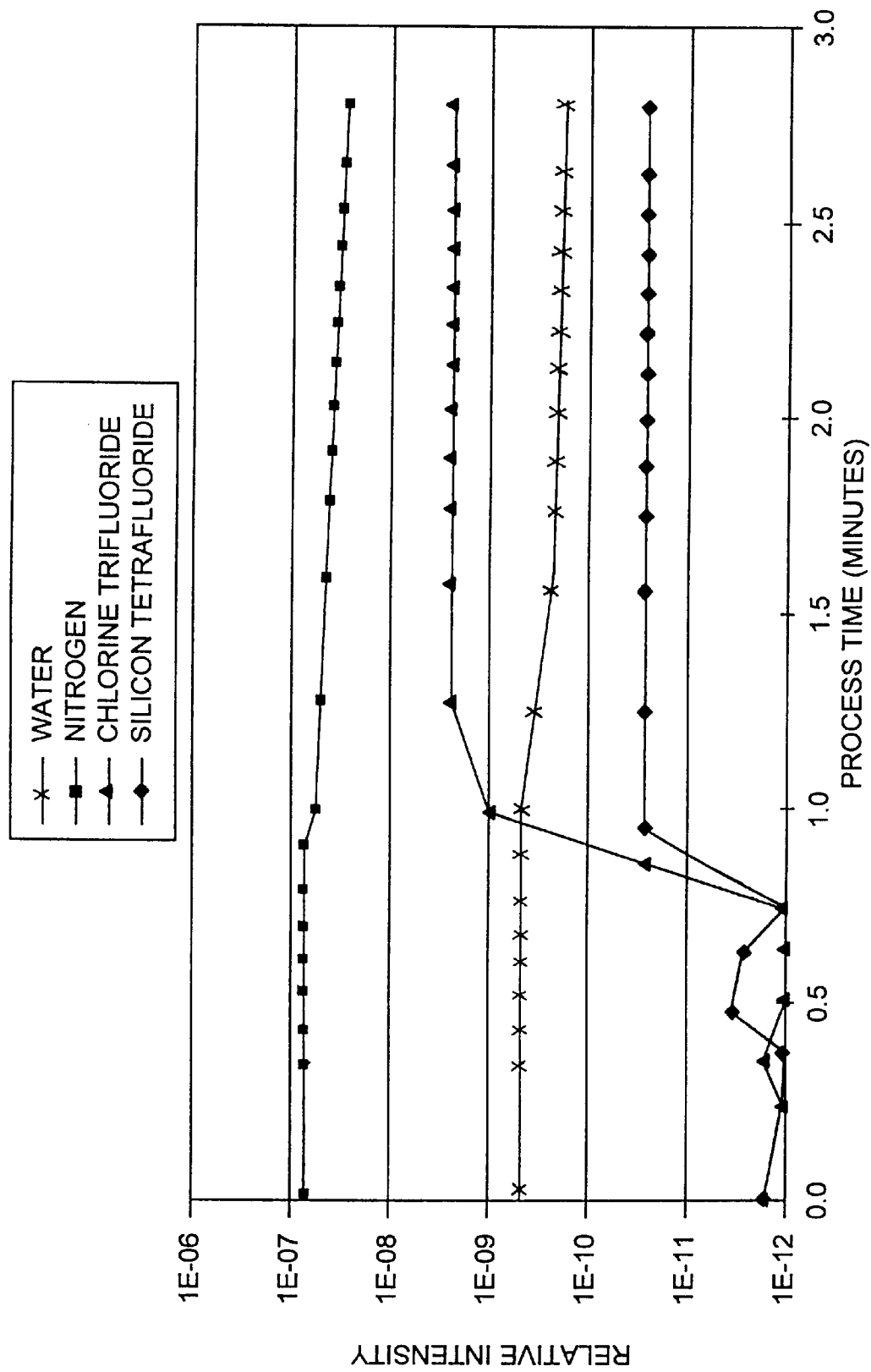
FIG. 4 is a graph showing a representative mass spectrum of reaction products which are generated during the UV/$ClF_3$ removal of a thermal oxide film.

During processing as described in Example 1 a residual gas analyzer (RGA) mass spectrometer was used to sample the gases leaving the process chamber. The RGA was capable of measuring moisture levels down to approximately 1 part per million in the process chamber exhaust gas stream. FIG. 4 shows the results of this analysis during the process described in Example 1. The graph shows mass signals associated with water, nitrogen, chlorine trifluoride, and silicon tetrafluoride as a function of process time. The process starts with a flow of 100% nitrogen. At a process time of approximately 0.7 minutes, the flow of $ClF_3$ and the UV illumination is started. Process pressure was 100 torr. Total gas flow rate was 1000 sccm. Initial substrate temperature was 150° C. The gas mixture was 25% $ClF_3$ and 75% $N_2$ after 0.7 minutes. A background water signal is observed prior to processing. However, no substantial rise is seen in this signal as a result of the UV/$ClF_3$ etching of silicon oxide, indicating that water is not substantially produced as a reaction by-product. Silicon tetrafluoride is observed as a primary reaction product.

EXAMPLE 4

Figure 6:
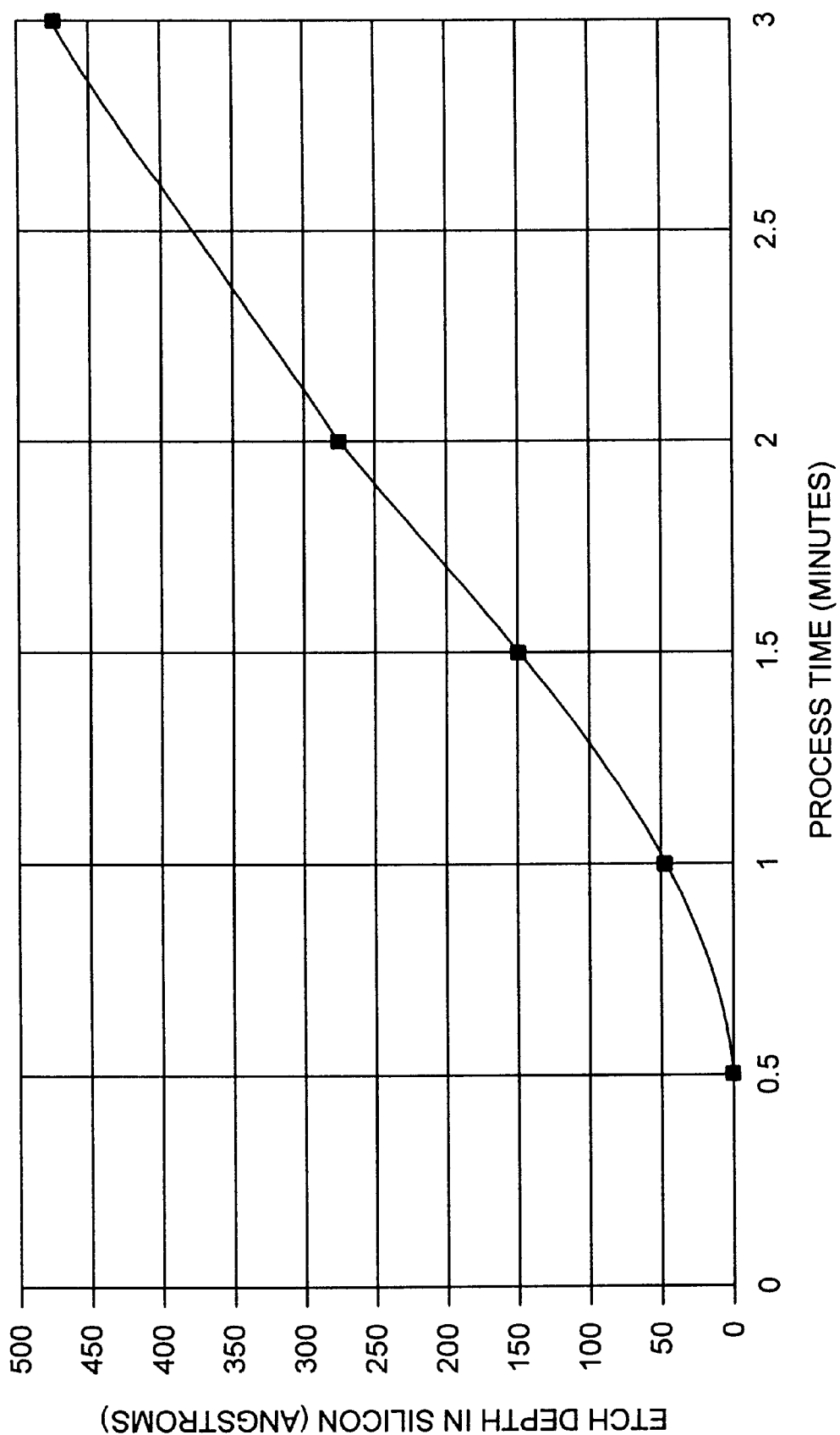
FIG. 6 is a graph showing the time necessary to remove a in (10 to 15 Å) chemical oxide film from the silicon surface at the bottom of a patterned thermal oxide film (see FIG. 5) using a UV/$ClF_3+Cl_2$ process.

A silicon dioxide masking film was prepared over a p-doped silicon <100> substrate wafer. The masking pattern exhibited lines and contact vias with lateral dimensions ranging from 1–5 $\mu$m. The wafers were briefly exposed to a liquid chemical cleaning process comprised of four steps in which the wafer surface was exposed first to an aqueous mixture of sulfuric acid and hydrogen peroxide, second to an aqueous mixture of dilute hydrofluoric acid, third to an aqueous mixture of ammonium hydroxide and hydrogen peroxide, and fourth to an aqueous mixture of hydrochloric acid and hydrogen peroxide. This chemical process leaves a 10 to 15 angstrom chemical oxide film over the exposed silicon regions. These wafers were exposed to UV light and a mixture of 2.5 sccm $ClF_3$, 50 sccm $Cl_2$, and 945 sccm nitrogen at 100 torr for time periods ranging from 30 seconds to 3 minutes. The wafer substrate temperature preceding UV exposure was 100° C. The wafers were removed from the process chamber, and the silicon dioxide mask was subsequently stripped using a liquid HF solution which is known not to attack the underlying silicon. The depth of etching which the UV/$ClF_3$+$Cl_2$ process achieved in the underlying p-silicon substrate layer after removal of the thin film chemical oxide was then measured using a stylus profilometer. The results are plotted in FIG. 6, in which no etching in the p-silicon substrate was detected at 30 seconds of process exposure. However, at process exposure times of 1 minute and greater, silicon was removed in the unmasked line and via areas to an increasingly greater depth. Linear extrapolation of this rate data suggests that a UV process time of 30 to 45 seconds was required to remove the chemical oxide layer. Addition of chlorine into the process mixture results in much smoother surface morphologies in the underlying silicon as compared to UV/$ClF_3$-only processes. Also, $Cl_2$ addition has been shown to enhance the removal of trace metallic contamination from the silicon substrate as illustrated in the following example.

EXAMPLE 5

Figure 7:
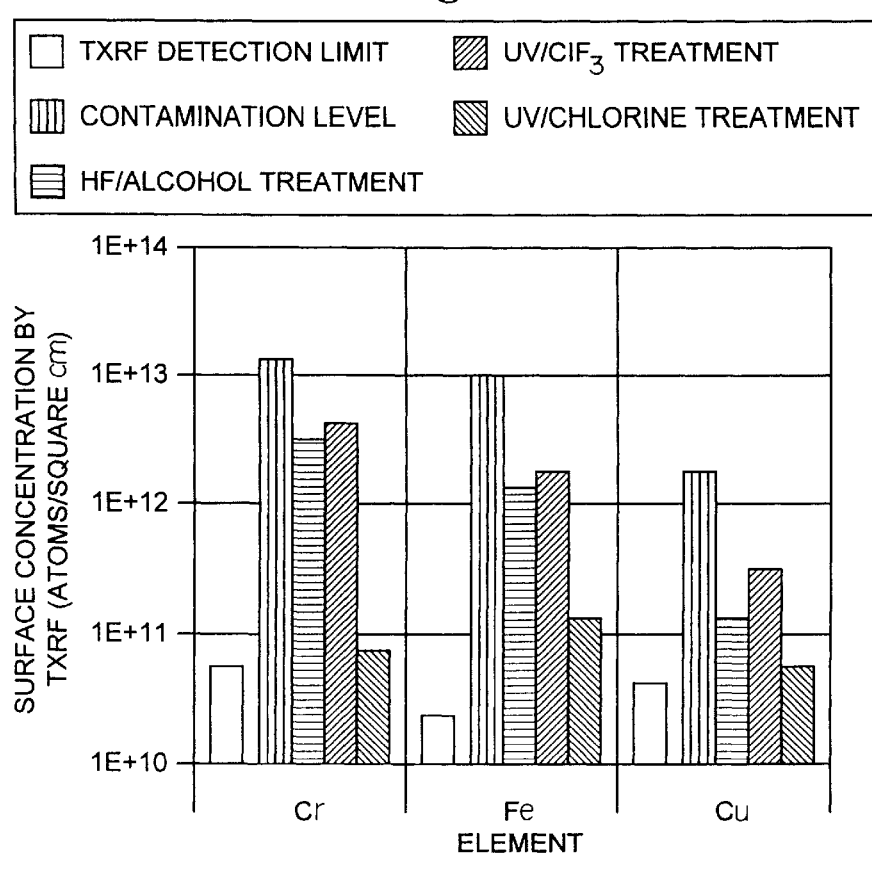
FIG. 7 is a graph showing the relative removal of various trace metallic contaminants from a silicon substrate as a result of HF/alcohol, UV/$ClF_3$ and UV/$Cl_2$ processes.

The removal of metallic contamination from the surface of a silicon substrate was demonstrated with the disclosed invention and compared to metallic contamination removal with HF/alcohol and UV/$Cl_2$ processes. FIG. 7 is a graph showing the results of this demonstration. Silicon wafers were first contaminated by applying a photoresist, and then removing that photoresist with an oxygen plasma process. Metallic impurities in the photoresist were left on the wafer (indicated as "contamination level" in FIG. 7). The surface concentration of these impurities was measured by total reflectance x-ray fluorescence with the detection limits as indicated in FIG. 7. Data for chromium, iron and copper are shown in FIG. 7. The HF/alcohol treatment consisted of exposure of the contaminated silicon surface to a mixture of 60% HF and 40% isopropanol in a $N_2$ carrier at a total flow rate of 500 sccm, a pressure of 100 torr, and a temperature of 100° C. for 5 minutes. The UV/$ClF_3$ treatment consisted of exposure of the contaminated silicon surface to a mixture of 0.86% $ClF_3$ and 99.14% $N_2$ at a total flow rate of 500 sccm, a pressure of 50 torr and an initial temperature of 100° C. for 2 minutes. The UV/$Cl_2$ treatment consisted of exposure of the contaminated silicon surface first to the HF/alcohol treatment described above and then to a mixture of 9% $Cl_2$ and 91% $N_2$ at a total flow rate of 550 sccm, a pressure of 100 torr and an initial temperature of 100° C. for 2.5 minutes. Both HF/alcohol and UV/$ClF_3$ achieve about a 10× reduction in the level of contamination of the metals shown in FIG. 7. The use of UV/$Cl_2$ achieves about a 100× reduction in those contaminants. The addition of $Cl_2$ to the UV/$ClF_3$ process will achieve the metals removal demonstrated by UV/$Cl_2$ alone while maintaining the oxide removal advantages of the UV/$ClF_3$ process of the present invention.

EXAMPLE 6

A mixture of $F_2$ and $Cl_2$ was used in place of $ClF_3$ in the process of Example 1 described above. Films of thermally grown silicon oxide and of deposited BPSG, as described in Example 2, were removed from a silicon wafer. $F_2$ and $Cl_2$ were flowed in a nitrogen carrier in a radial laminar flow over substrate wafers at 1000 sccm. The total process pressure of the $F_2$, $Cl_2$ and nitrogen gas mixture was held at 100 torr. The initial wafer temperature preceding UV lamp exposure was 100° C. The gas mixture and the substrate were simultaneously exposed to direct UV illumination from a medium pressure mercury arc lamp for 1.5 minutes. The process chamber was then evacuated to its base pressure and the wafer was removed through the load-lock. The thickness of the remaining film was then measured by spectroscopic reflectometry and compared with measurements made before processing to determine the amount of film removed during the process.

FIG. 9 is a graph of the results of the process runs described in the preceding paragraph. Film removal over a 1.5 minute exposure of the films is plotted for a mixture of 50% $F_2$ in nitrogen and a mixture of 50% $F_2$ and 25% $Cl_2$ in nitrogen. For the UV/$F_2$ process, the thermal silicon oxide was removed at 600 angstroms/minute, while the BPSG was etched twice as fast at 1200 angstroms/minute. For the UV/$F_2$+$Cl_2$ process, the chlorine addition suppressed thermal oxide etching to about 10 angstroms/minute, while the BPSG etching rate was reduced to 92 angstroms/minute. This data demonstrates that the properties of silicon oxide removal with UV/$F_2$ and UV/$F_2$+$Cl_2$ processes are similar to those seen for UV/$ClF_3$ and UV/$ClF_3$+$Cl_2$ processes, although each method retains specific advantages.

EXAMPLES 7–11

A significant aspect of these examples is the efficient removal of carbon with the combination of halogen and oxygen gases under UV illumination as compared to each gas alone. Also, the surface treated with $F_2$+$O_2$ seemed to be resistant to recontamination by adventitous atmospheric hydrocarbons.

In these examples organic contamination was removed from the surface of a silicon wafer utilizing the methods described in the present invention. Contamination was introduced on the surface of a boron-doped, <100> surface orientation, silicon wafer by applying a highly diluted mixture of positive novolac photoresist in acetone onto the spinning wafer. The resulting organic film was approximately 100 Å or less in thickness as indicated by ellipsometry and by low angle X-ray photoelectron spectroscopy analysis (XPS). Wafers were exposed to several different process involving difference gas mixtures with UV illumination. The gas mixtures included oxygen ($O_2$) only, chlorine ($Cl_2$)+nitrogen ($N_2$), fluorine ($F_2$)+$N_2$, $Cl_2$+$O_2$ and $F_2$+$O_2$. Conditions of each process are listed in Table 1.

TABLE 1

| | | Process conditions | | | |
|---|---|---|---|---|---|
| Example No. | Process | Flows (sccm) | Pressure (torr) | Temp. (C°) | Duration (minutes) |
| 7* | $O_2$ | $O_2$: 1000 | 400 | 130 | 3 |
| 8* | $Cl_2$ + $N_2$ | $Cl_2$: 50 $N_2$: 950 | 400 | 130 | 3 |
| 9* | $F_2$ + $N_2$ | $F_2$: 10 $N_2$: 490 | 400 | 130 | 3 |
| 10* | $Cl_2$ + $O_2$ | $Cl_2$: 50 $O_2$: 950 | 400 | 130 | 3 |
| 11* | $F_2$ + $O_2$ | $F_2$: 10 $O_2$: 490 | 400 | 130 | 3 |

Comparative examples

Results of XPS analysis of the silicon surface before and after processing are shown in Table 2. XPS analysis indicated the reduction of carbon from a level of 84% to a level of <1% with the $F_2$+$O_2$ process. The relative abundance of elements within 100 Å of the surface of the wafer before and after the cleaning process are indicated in Table 2. Subsequent analysis of the silicon surface treated with $F_2$+$O_2$ after 15 hours of ambient exposure indicated no significant change in the carbon content.

TABLE 2

Surface analysis results.

| | | Elemental abundance by XPS (%) | | | | |
|---|---|---|---|---|---|---|
| Example | Process | C | O | Si | F | Cl |
| control | none | 84 | 14 | 2 | <1 | <1 |
| 7* | $O_2$ | 60 | 33 | 4 | nd | nd |
| 8* | $Cl_2$ + $N_2$ | 60 | 5 | 1 | nd | 34 |
| 9* | $F_2$ + $N_2$ | 17 | 34 | 26 | 23 | nd |
| 10* | $Cl_2$ + $O_2$ | 9 | 45 | 43 | <1 | 2 |
| 11 | $F_2$ + $O_2$ | <1 | 51 | 43 | 18 | <1 |

*Comparative examples. "nd" indicates analysis not done

The amount of silicon potentially removed with the $F_2$+$O_2$ process was determined independently by exposing a wafer with an oxide mask and open areas of silicon to the cleaning process. After exposure to the process, the oxide mask was removed and the amount of silicon removed during the cleaning process was determined by stylus profilometry as described in Example 4 above. The results of that test indicate that less than 50 Å of silicon are removed during this 180 second process.

The roughness of the surface was also measured after the cleaning process by atomic force microscopy (AMF). The surface of the wafer used in the original experiment described above was analyzed near the center of the wafer. AFM measurements were taken at 2 1-micron square sites. The roughness was measured as <1 Å Ra. This is equivalent to the roughness of a new silicon wafer. Maintenance of a smooth surface during cleaning processes is critical since surface roughness has been shown to significantly degrade the performance of semiconductor devices.

EXAMPLE 12

Further tests as in examples 7–11 using UV and an 8% (volume basis) mixture of $F_2$ in $O_2$ gave significant etching of silicon whereas UV/4% $F_2$/$O_2$ results indicated that a passivating thin (7–9 Å) silicon oxyfluoride was formed (approximately 30% F and 70% O) with negligible etch of silicon, negligible hydrocarbon recontamination following 12 hours exposure to ambient atmosphere, and with a surface roughness comparable to RCA cleaned silicon control. These results indicate that UV/$F_2$/$O_2$ processes, particularly at a $F_2$ concentration of less than 8%, are suited to pre-gate insulator surface conditioning applications.

The present invention may be embodied in other specific forms without departing from the spirit or essential attributes thereof, reference being made to the appended claims rather than to the foregoing description to indicate the scope of the invention.

What is claimed is:

1. A method of removing an undesired material from a substrate, the undesired material comprising a material containing carbon atoms, the method comprising placing the substrate in a gaseous environment, the gaseous environment comprising oxygen and at least one fluorine-containing gas selected from the group consisting of fluorine and fluorine containing gases, other than $F_2O$, which are free of hydrogen and which can be photodissociated, and the gaseous environment being substantially free of plasma products, water, hydrogen, hydrogen fluoride and hydrogen containing organic compounds, and exposing the substrate to UV irradiation in the presence of the gaseous environment until the undesired material has been removed.

2. A method as in claim 1 wherein the fluorine-containing gas in the gaseous environment is selected from the group consisting fluorine, fluorine interhalogens, fluorides of sulfur and xenon difluoride.

3. A method as in claim 2 wherein the fluorine-containing gas in the gaseous environment is selected from the group consisting of fluorine, chlorine trifluoride, bromine trifluoride, bromine pentafluoride, iodine pentafluoride, xenon difluoride, sulfur hexafluoride and mixtures thereof.

4. A method as in claim 1 wherein the substrate comprises silicon, silicon oxide or gallium arsenide.

5. A method as in claim 1, wherein the gaseous environment further comprises an inert gas.

6. A method as in claim 5, wherein the inert gas is selected from the group consisting of helium (He), argon (Ar), and nitrogen ($N_2$).

7. A method as in claim 1, wherein the substrate further comprises on at least a portion of the surface thereof a desired silicon oxide material which is intended to be retained on the substrate, the desired silicon oxide material being selected from the group consisting of doped silicon oxide, deposited silicon oxide, and thermally grown silicon oxide.

8. A method as in claim 7, wherein the desired silicon oxide material intended to be retained is a doped silicon oxide selected from the group consisting of boron and phosphorus doped silica glass (BPSG), phosphorus doped silica glass (PSG), boron doped silica glass (BSG), and spin-on glass (SOG).

9. A method as in claim 7, wherein the desired silicon oxide material comprises a composite film structure including alternating layers of undoped silicon oxide and doped silicon oxide.

10. A method as in claim 1, wherein the undesired material comprises one or more organic compounds.

11. A method as in claim 1, wherein the substrate temperature is maintained below 400 degrees centigrade and the partial pressure of the fluorine containing gas in the gaseous environment is less than or equal to 1 atmosphere.

12. A method as in claim 1 wherein the fluorine-containing gas is $F_2$.

13. A method as in claim 1 wherein the gaseous environment is a mixture of fluorine and oxygen, the fluorine comprising less than 8% by volume of said mixture.

14. A method as in claim 13 wherein the fluorine content is about 4% by volume of said mixture.

15. A method as in claim 1, wherein the substrate has a surface having topographical features and the undesired material exists on the bottom of the topographic features.

16. A method as in claim 1, wherein the substrate has a surface having topographical features and the undesired material exists on the sidewalls of the topographic features.

17. A silicon wafer substrate having a passivated terminal surface layer over silicon, the layer being of silicon, oxygen and fluorine, and the layer having an abundance of F atoms and O atoms in a ratio of about 30:70.

18. A silicon wafer substrate as in claim 17 wherein said terminal surface layer is about 9 Å or less.

19. A process for surface conditioning a silicon wafer substrate comprising:

placing the substrate in a gaseous environment, the gaseous environment comprising a mixture of oxygen and at least one fluorine-containing gas selected from the group consisting of fluorine and fluorine containing gases, other than $F_2O$, which are free of hydrogen and which can be photodissociated, and the gaseous environment being substantially free of plasma products, water, hydrogen, hydrogen fluoride and hydrogen containing organic compounds, the amount of fluorine-containing gas in said mixture being less than 8% by volume and exposing the substrate to UV irradiation in the presence of the gaseous environment.

20. A process as in claim 19 wherein the fluorine-containing gas is fluorine.

21. A process as in claim 20 wherein the amount of fluorine in said mixture is about 4% by volume.

* * * * *

UNITED STATES PATENT AND TRADEMARK OFFICE
CERTIFICATE OF CORRECTION

PATENT NO.    : 6,124,211
DATED         : September 26, 2000
INVENTOR(S)   : Butterbaugh et al.

It is certified that error appears in the above-identified patent and that said Letters Patent is hereby corrected as shown below:

Title page,
Item [*] Notice, delete "0" and insert -- 818 --.

Signed and Sealed this

Second Day of August, 2005

JON W. DUDAS
*Director of the United States Patent and Trademark Office*